United States Patent
Xie et al.

(10) Patent No.: US 11,346,586 B2
(45) Date of Patent: May 31, 2022

(54) ELECTROCALORIC HEAT TRANSFER SYSTEM WITH PATTERNED ELECTRODES

(71) Applicant: Carrier Corporation, Palm Beach Gardens, FL (US)

(72) Inventors: Wei Xie, Manchester, CT (US); Subramanyaravi Annapragada, South Windsor, CT (US); Joseph V. Mantese, Ellington, CT (US); Scott Alan Eastman, Glastonbury, CT (US); Parmesh Verma, South Windsor, CT (US); Suman Dwari, Vernon, CT (US); Michael L. Perry, Glastonbury, CT (US); Vladimir Blasko, Avon, CT (US)

(73) Assignee: CARRIER CORPORATION, Palm Beach Gardens, FL (US)

( * ) Notice: Subject to any disclaimer, the term of this patent is extended or adjusted under 35 U.S.C. 154(b) by 217 days.

(21) Appl. No.: 16/623,351

(22) PCT Filed: Jun. 18, 2018

(86) PCT No.: PCT/US2018/038060
§ 371 (c)(1),
(2) Date: Dec. 16, 2019

(87) PCT Pub. No.: WO2018/232395
PCT Pub. Date: Dec. 20, 2018

(65) Prior Publication Data
US 2020/0158385 A1 May 21, 2020

Related U.S. Application Data

(60) Provisional application No. 62/521,247, filed on Jun. 16, 2017.

(51) Int. Cl.
*F25B 21/00* (2006.01)
*F28F 13/16* (2006.01)
(Continued)

(52) U.S. Cl.
CPC .............. *F25B 21/00* (2013.01); *F28F 13/16* (2013.01); *F25B 2321/001* (2013.01);
(Continued)

(58) Field of Classification Search
CPC ................ F25B 21/00; F25B 2321/001; F25B 2321/0022; F25B 2321/0023
See application file for complete search history.

(56) References Cited

U.S. PATENT DOCUMENTS 4,515,206 A 5/1985 Carr
6,247,524 B1 6/2001 Slasky
(Continued)

FOREIGN PATENT DOCUMENTS

CN 106369867 A 2/2017
EP 3106781 A1 12/2016
(Continued)

OTHER PUBLICATIONS

International Search Report Issued in International Application No. PCT/US2018/038060 dated Sep. 17, 2018; 6 Pages.
(Continued)

*Primary Examiner* — Ana M Vazquez
(74) *Attorney, Agent, or Firm* — Cantor Colburn LLP

(57) ABSTRACT

An electrocaloric module includes an electrocaloric element that includes an electrocaloric film, a first electrode on a first surface of the electrocaloric film, and a second electrode on a second surface of the electrocaloric film. A support is attached along an edge portion of the electrocaloric film, leaving a central portion of the electrocaloric film unsupported film. At least one of the first and second electrodes includes a patterned disposition of conductive material on the film surface. The electrocaloric module also includes a first thermal connection configured to connect to a first thermal flow path between the electrocaloric element and a
(Continued)

heat sink, a second thermal connection configured to connect to a second thermal flow path between the electrocaloric element and a heat source, and a power connection connected to the first and second electrodes and configured to connect to a power source.

17 Claims, 5 Drawing Sheets

(51) Int. Cl.
H01L 35/00 (2006.01)
H01L 37/02 (2006.01)

(52) U.S. Cl.
CPC ............... *F25B 2321/0022* (2013.01); *F25B 2321/0023* (2013.01); *H01L 35/00* (2013.01); *H01L 37/025* (2013.01)

(56) References Cited

U.S. PATENT DOCUMENTS

| 6,877,325 | B1* | 4/2005 | Lawless | F25B 21/00 62/3.1 |
|---|---|---|---|---|
| 9,326,423 | B2 | 4/2016 | Defay et al. | |
| 2008/0303375 | A1 | 12/2008 | Carver | |
| 2010/0037624 | A1 | 2/2010 | Epstein et al. | |
| 2010/0039208 | A1 | 2/2010 | Epstein et al. | |
| 2010/0175392 | A1 | 7/2010 | Malloy et al. | |
| 2011/0016885 | A1 | 1/2011 | Zhang et al. | |
| 2011/0146308 | A1 | 6/2011 | Casasanta | |
| 2014/0373890 | A1 | 12/2014 | Thevasahayam | |
| 2016/0087185 | A1 | 3/2016 | Cheng | |
| 2016/0187034 | A1 | 6/2016 | Malic et al. | |
| 2017/0030611 | A1* | 2/2017 | Radcliff | F25B 9/145 |
| 2017/0329436 | A1* | 11/2017 | Choi | G02F 1/133305 |

FOREIGN PATENT DOCUMENTS

| JP | 2015094552 A | 5/2015 |
| WO | 2006056809 A1 | 6/2006 |
| WO | 2015156794 A1 | 10/2015 |
| WO | 2016156074 A1 | 10/2016 |
| WO | 2017030529 A1 | 2/2017 |

OTHER PUBLICATIONS

Written Opinion Issued in International Application No. PCT/US2018/038060 dated Sep. 17, 2018; 8 Pages.

* cited by examiner

ELECTROCALORIC HEAT TRANSFER SYSTEM WITH PATTERNED ELECTRODES

CROSS-REFERENCE TO RELATED APPLICATIONS

This application is the National Stage of International Patent Application No. PCT/US2018/038060 filed Jun. 18, 2018, which claims priority to U.S. Provisional Patent Application No. 62/521,247 filed Jun. 16, 2017, the disclosure of which is incorporated herein by reference in its entirety.

BACKGROUND

A wide variety of technologies exist for cooling applications, including but not limited to evaporative cooling, convective cooling, or solid state cooling such as electrothermic cooling. One of the most prevalent technologies in use for residential and commercial refrigeration and air conditioning is the vapor compression refrigerant heat transfer loop. These loops typically circulate a refrigerant having appropriate thermodynamic properties through a loop that comprises a compressor, a heat rejection heat exchanger (i.e., heat exchanger condenser), an expansion device and a heat absorption heat exchanger (i.e., heat exchanger evaporator). Vapor compression refrigerant loops effectively provide cooling and refrigeration in a variety of settings, and in some situations can be run in reverse as a heat pump. However, many of the refrigerants can present environmental hazards such as ozone depleting potential (ODP) or global warming potential (GWP), or can be toxic or flammable. Additionally, vapor compression refrigerant loops can be impractical or disadvantageous in environments lacking a ready source of power sufficient to drive the mechanical compressor in the refrigerant loop. For example, in an electric vehicle, the power demand of an air conditioning compressor can result in a significantly shortened vehicle battery life or driving range. Similarly, the weight and power requirements of the compressor can be problematic in various portable cooling applications.

Accordingly, there has been interest in developing cooling technologies as alternatives to vapor compression refrigerant loops. Various technologies have been proposed such as field-active heat or electric current-responsive heat transfer systems relying on materials such as electrocaloric materials, magnetocaloric materials, or thermoelectric materials. However, many proposals have been configured as bench-scale demonstrations with limited capabilities.

BRIEF DESCRIPTION

In some embodiments of this disclosure, an electrocaloric module comprises an electrocaloric element comprising an electrocaloric film, a first electrode on a first surface of the electrocaloric film, and a second electrode on a second surface of the electrocaloric film. A support is attached along an edge portion of the electrocaloric film, leaving a central portion of the electrocaloric film unsupported film. At least one of the first and second electrodes comprises a patterned disposition of conductive material on the film surface. The electrocaloric module also includes a first thermal connection configured to connect to a first thermal flow path between the electrocaloric element and a heat sink, a second thermal connection configured to connect to a second thermal flow path between the electrocaloric element and a heat source, and a power connection connected to the electrodes configured to connect to a power source.

In some embodiments, a heat transfer system comprises the above-described electrocaloric module, a first thermal flow path between the electrocaloric elements and a heat sink through the first thermal connection, a second thermal flow path between the electrocaloric elements and a heat source through the second thermal connection, an electrical connection between a power source and the electrodes further through the power connection, and a controller configured to selectively apply voltage to activate the electrodes in coordination with heat transfer along the first and second thermal flow paths to transfer heat from the heat source to the heat sink.

According to any one or combination of the above embodiments, the electrocaloric module can comprise a plurality of electrocaloric elements that individually comprise an electrocaloric film, a first electrode on a first surface of the electrocaloric film, and a second electrode on a second surface of the electrocaloric film.

In some embodiments, a method of transferring heat comprises selectively applying voltage to activate electrodes on first and second surfaces of an electrocaloric material disposed in an electrocaloric module, wherein the electrocaloric film is supported along an edge portion of the elctrocaloric film and unsupported along a central portion of the electrocaloric film, and at least one of the electrodes comprises a patterned disposition of conductive material on the film surface. Further according to the method, heat is transferred, in coordination with application of voltage to the electrodes, from the heat source to the electrocaloric material and from the electrocaloric material to the heat sink.

According to any one or combination of the above embodiments, the first and second electrodes can be on the same side of the electrocaloric film.

According to any one or combination of the above embodiments, the first and second electrodes can be on opposite sides of the electrocaloric film.

According to any one or combination of the above embodiments, the patterned disposition of conductive material can comprise a plurality of areas on the electrocaloric film surface comprising the conductive material separated by non-conductive spacer areas on the electrocaloric film.

In some embodiments, the plurality of areas on the electrocaloric film surface comprising the conductive material spacer areas can be spaced apart by a dimension of 0.1 times the film thickness to 10 times the film thickness.

In some embodiments, the plurality of areas on the electrocaloric film surface comprising the conductive material spacer areas can be spaced apart by a dimension of 0.2 times the film thickness to 5 times the film thickness.

In some embodiments, the plurality of areas on the electrocaloric film surface comprising the conductive material can be spaced apart by a dimension of 0.5 times the film thickness to 2 times the film thickness.

According to any one or combination of the above embodiments, the plurality of areas on the electrocaloric film surface comprising the conductive material can be configured as a plurality of linear extensions of conductive material along the film surface extending perpendicular to a strain vector on the electrocaloric film during operation.

According to any one or combination of the above embodiments, the plurality of areas on the electrocaloric film surface comprising the conductive material can be configured as a plurality of linear extensions of conductive material along the film surface separated by spacer areas.

According to any one or combination of the above embodiments, the linear extensions of conductive material can extend perpendicular to a strain vector on the electrocaloric film during operation.

According to any one or combination of the above embodiments, the linear extensions of conductive material can extend parallel to a line between supported edges at opposite ends of the electrocaloric film.

According to any one or combination of the above embodiments, the linear extensions of conductive material can extend in at least two directions.

According to any one or combination of the above embodiments, the linear extensions of conductive material can extend omnidirectionally.

According to any one or combination of the above embodiments, the supported edge portion of the electrocaloric film can extend partly around the edge of electrocaloric film.

According to any one or combination of the above embodiments, the supported edge portion of the electrocaloric film can extend completely around the edge of electrocaloric film.

According to any one or combination of the above embodiments, the electrocaloric film can be square or rectangle shaped and the supported edge portion of the electrocaloric film extends along two opposing sides of the square or rectangle.

According to any one or combination of the above embodiments, the electrocaloric film can be square or rectangle shaped and the supported edge portion of the electrocaloric film extends along all sides of the square or rectangle.

According to any one or combination of the above embodiments, the patterned disposition of conductive material can comprise a variation in thickness in a direction normal to the film surface.

BRIEF DESCRIPTION OF THE DRAWINGS

Subject matter of this disclosure is particularly pointed out and distinctly claimed in the claims at the conclusion of the specification. The foregoing and other features, and advantages of the present disclosure are apparent from the following detailed description taken in conjunction with the accompanying drawings in which:

DETAILED DESCRIPTION

Figure 1:
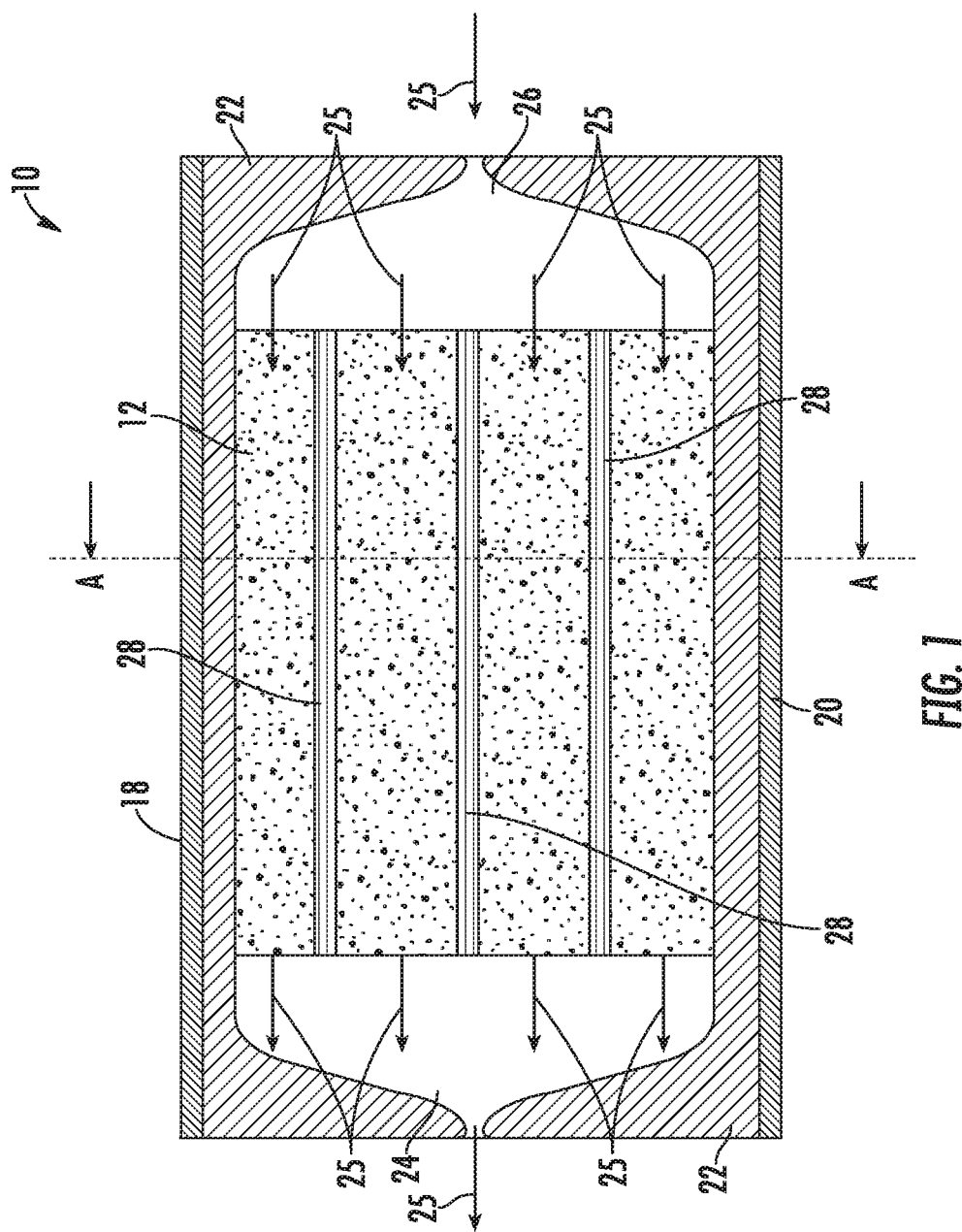
FIG. 1 is a schematic depiction of a top view of an example embodiment of an electrocaloric heat transfer module.
Figure 2:
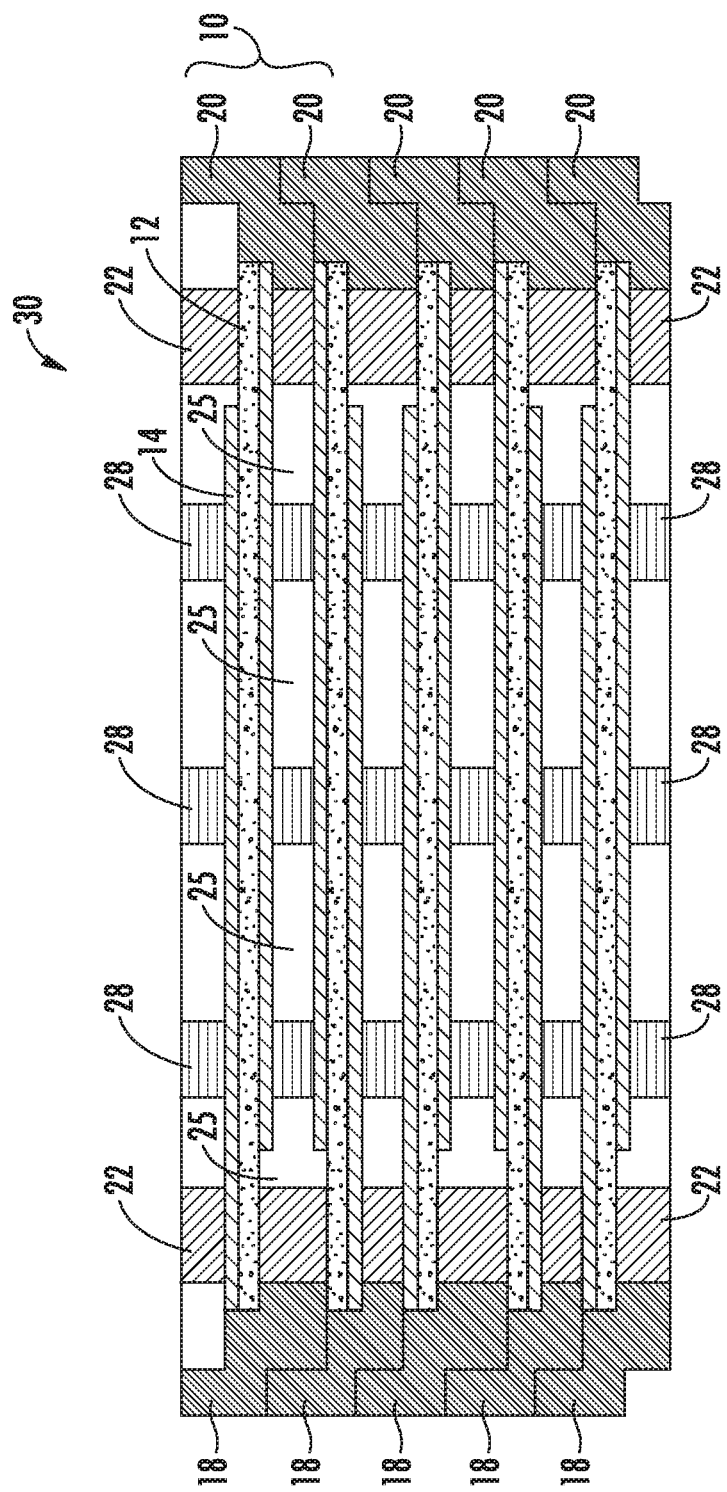
FIG. 2 is a schematic depiction of a cross-sectional side view of an electrocaloric stack including the module of FIG. 1.

As mentioned above, a heat transfer system is disclosed that comprises an electrocaloric module. Example embodiments of such modules are schematically depicted in FIGS. 1 and 2. Although any directions described herein (e.g., "up", "down", "top", "bottom", "left", "right", "over", "under", etc.) are considered to be arbitrary and to not have any absolute meaning but only a meaning relative to other directions, FIG. 1 can be described as a "top" view of an example embodiment of a module and FIG. 2 can be described as a "side" cross-section view taken along the line A↔A shown in FIG. 1. As shown in FIGS. 1 and 2, an electrocaloric module 10 comprises an electrocaloric element that comprises an electrocaloric film 12, a first electrode 14 on a first side of the film and a second electrode 16 on a second side of the film. It is noted that, for ease of illustration so that details of the electrocaloric film 12 and other components are not obscured, the electrodes 14, 16 are omitted from FIG. 1 and are only illustrated in FIGS. 2 and 4.

The electrocaloric film 12 can comprise any of a number of electrocaloric materials. In some embodiments, electrocaloric film thickness can be in a range having a lower limit of 0.1 nm, more specifically 0.5 nm, and even more specifically 1 nm. In some embodiments, the film thickness range can have an upper limit of 1000 μm, more specifically 100 μm, and even more specifically 10 μm. It is understood that these upper and lower range limits can be independently combined to disclose a number of different possible ranges. Examples of electrocaloric materials for the electrocaloric film can include but are not limited to inorganic materials (e.g., ceramics), electrocaloric polymers, and polymer/ceramic composites. Examples of inorganics include but are not limited to $PbTiO_3$ ("PT"), $Pb(Mg_{1/3}Nb_{2/3})O_3$ ("PMN"), PMN-PT, $LiTaO_3$, barium strontium titanate (BST) or PZT (lead, zirconium, titanium, oxygen). Examples of electrocaloric polymers include, but are not limited to ferroelectric polymers, liquid crystal polymers, and liquid crystal elastomers.

Ferroelectric polymers are crystalline polymers, or polymers with a high degree of crystallinity, where the crystalline alignment of polymer chains into lamellae and/or spherulite structures can be modified by application of an electric field. Such characteristics can be provided by polar structures integrated into the polymer backbone or appended to the polymer backbone with a fixed orientation to the backbone. Examples of ferroelectric polymers include polyvinylidene fluoride (PVDF), polytriethylene fluoride, odd-numbered nylon, copolymers containing repeat units derived from vinylidene fluoride, and copolymers containing repeat units derived from triethylene fluoride. Polyvinylidene fluoride and copolymers containing repeat units derived from vinylidene fluoride have been widely studied for their ferroelectric and electrocaloric properties. Examples of vinylidene fluoride-containing copolymers include copolymers with methyl methacrylate, and copolymers with one or more halogenated co-monomers including but not limited to trifluoroethylene, tetrafluoroethylene, chlorotrifluoroethylene, trichloroethylene, vinylidene chloride, vinyl chloride, and other halogenated unsaturated monomers.

Liquid crystal polymers, or polymer liquid crystals comprise polymer molecules that include mesogenic groups. Mesogenic molecular structures are well-known, and are often described as rod-like or disk-like molecular structures having electron density orientations that produce a dipole moment in response to an external field such as an external electric field. Liquid crystal polymers typically comprise numerous mesogenic groups connected by non-mesogenic molecular structures. The non-mesogenic connecting structures and their connection, placement and spacing in the polymer molecule along with mesogenic structures are important in providing the fluid deformable response to the external field. Typically, the connecting structures provide stiffness low enough so that molecular realignment is induced by application of the external field, and high enough to provide the characteristics of a polymer when the external field is not applied.

In some exemplary embodiments, a liquid crystal polymer can have rod-like mesogenic structures in the polymer backbone separated by non-mesogenic spacer groups having flexibility to allow for re-ordering of the mesogenic groups in response to an external field. Such polymers are also known as main-chain liquid crystal polymers. In some exemplary embodiments, a liquid crystal polymer can have rod-like mesogenic structures attached as side groups attached to the polymer backbone. Such polymers are also known as side-chain liquid crystal polymers.

With continued reference to FIG. 1, first electrode 14 is electrically connected to a first electrical bus element 18. Similarly, second electrode 16 is electrically connected to second electrical bus element 20. The bus elements include a power connection (not shown) configured to an electric power source (not shown). The electrodes can be any type of conductive material, including but not limited to metallized layers of a conductive metal such as aluminum or copper, or other conductive materials such as carbon (e.g., carbon nanotubes, graphene, or other conductive carbon). Noble metals can also be used, but are not required. Other conductive materials such as a doped semiconductor, ceramic, or polymer, or conductive polymers can also be used.

One or more support elements 22 can optionally be included for support and retention of the electrocaloric element. However, separate support elements are not required, as support and retention can also be provided by the bus elements as shown in FIG. 2 described below. As shown in FIG. 1, the support element(s) 22 can be configured to provide header spaces 24 and 26 for transport of working fluids to and from the electrocaloric element along fluid flow path 25. Although not required in all design configurations, in some embodiments, the support elements can be made from an electrically non-conductive material. Spacer elements 28 can optionally be included to help maintain separation from adjacent electrocaloric elements for a fluid flow path for a working fluid (e.g., either a fluid to be heated or cooled directly such as air, or a heat transfer fluid such as a dielectric organic compound). Any configuration of spacer elements can be utilized, such as a set of discrete disk spacer elements or linear or non-linear axially extending spacer elements.

Figure 3:
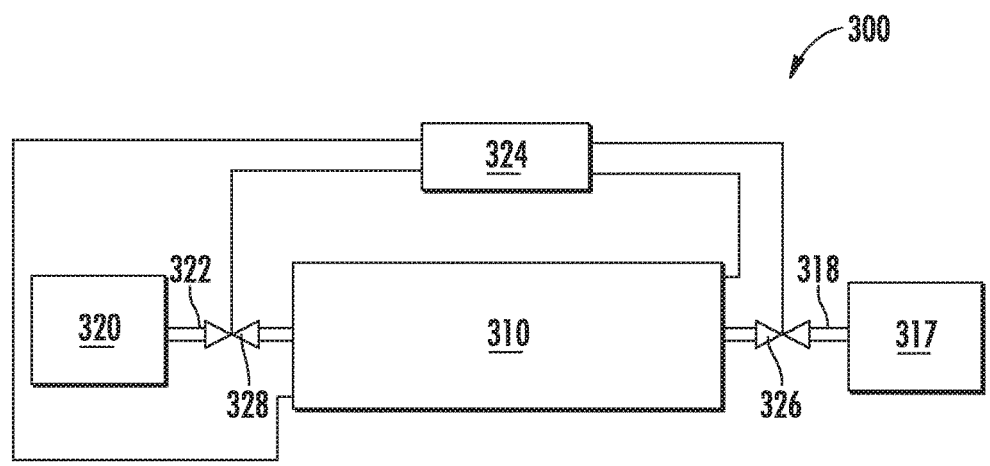
FIG. 3 is a schematic depiction of an example embodiment of an electrocaloric heat transfer system.

Turning now to FIG. 2 where like numbering is used as FIG. 1, a number of electrocaloric modules are shown assembled together in a stack 30. As can be seen in FIG. 3, the spacers promote maintaining a physical separation between adjacent electrocaloric elements to provide a fluid flow path 25 between the spacers and the adjacent electrocaloric elements. Although not required in all design configurations, in design configurations where the spacer elements are disposed adjacent to electrodes of opposite polarity, the spacer elements can be made from an electrically non-conductive material. In some embodiments, adjacent electrical bus elements 18, 20 can have an interlocking configuration (with complementary contour of projections and recesses where a projection of one bus element projects is adjacent or projects into to a complementary recess of an adjacent bus element) as shown in FIG. 2. The electrical bus elements fit together to form bus bars that are connected through electrical connections (not shown) to an electrical power source (not shown). The bus bars can also serve as housing 17 if they are insulated on the outer surface.

An example embodiment of a heat transfer system and its operation are further described with respect to FIG. 3. As shown in FIG. 3, a heat transfer system 300 comprises an electrocaloric module 310 such as the stack 30 of FIG. 2 or another configuration. The electrocaloric element is in thermal communication with a heat sink 317 through a first thermal flow path 318, and in thermal communication with a heat source 320 through a second thermal flow path 322. The thermal flow paths are described below with respect thermal transfer through flow of a heat transfer fluid through control valves 326 and 328 between the electrocaloric element and the heat sink and heat source, but can also be through conductive heat transfer through solid state heat thermoelectric switches in thermally conductive contact with the electrocaloric element and the heat source or heat sink, or thermomechanical switches in movable to establish thermally conductive contact between the electrocaloric element and the heat source or heat sink. A controller 324 is configured to control electrical current to through a power source (not shown) to selectively activate the electrodes 314, 316. The controller 324 is also configured to open and close control valves 326 and 328 to selectively direct the heat transfer fluid along the first and second flow paths 318 and 322.

In operation, the system 300 can be operated by the controller 324 applying an electric field as a voltage differential across the electrocaloric element to cause a decrease in entropy and a release of heat energy by the electrocaloric elements. The controller 324 opens the control valve 326 to transfer at least a portion of the released heat energy along flow path 318 to heat sink 317. This transfer of heat can occur after the temperature of the electrocaloric elements has risen to a threshold temperature. In some embodiments, heat transfer to the heat sink 317 is begun as soon as the temperature of the electrocaloric elements increases to be about equal to the temperature of the heat sink 317. After application of the electric field for a time to induce a desired release and transfer of heat energy from the electrocaloric elements to the heat sink 317, the electric field can be removed. Removal of the electric field causes an increase in entropy and a decrease in heat energy of the electrocaloric elements. This decrease in heat energy manifests as a reduction in temperature of the electrocaloric elements to a temperature below that of the heat source 320. The controller 324 closes control valve 326 to terminate flow along flow path 318, and opens control device 328 to transfer heat energy from the heat source 320 to the colder electrocaloric elements in order to regenerate the electrocaloric elements for another cycle.

In some embodiments, for example where a heat transfer system can be utilized to maintain a temperature in a conditioned space or thermal target, the electric field can be applied to the electrocaloric elements to increase its temperature until the temperature of the electrocaloric element reaches a first threshold. After the first temperature threshold, the controller 324 opens control valve 326 to transfer heat from the electrocaloric elements to the heat sink 317 until a second temperature threshold is reached. The electric field can continue to be applied during all or a portion of the time period between the first and second temperature thresholds, and is then removed to reduce the temperature of the electrocaloric elements until a third temperature threshold is reached. The controller 324 then closes control valve 326 to terminate heat flow transfer along heat flow path 318, and opens control valve 328 to transfer heat from the heat source 320 to the electrocaloric elements. The above steps can be optionally repeated until a target temperature of the conditioned space or thermal target (which can be either the heat source or the heat sink) is reached.

Figure 4:
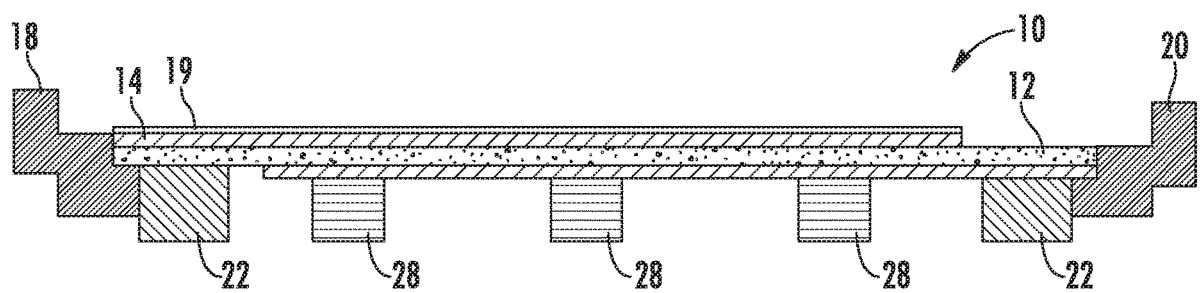
FIG. 4 is a schematic depiction of an electrocaloric module from the view of FIG. 2.

With reference now to FIG. 4, a side view of a side view of an electrocaloric element is schematically depicted. As shown in FIG. 4, first electrode 14 is electrically connected to a first electrical bus element 18. Similarly, second electrode 16 is electrically connected to second electrical bus element 20. The electrodes can be any type of conductive material, including but not limited to metallized layers of a conductive metal such as aluminum or copper, or other conductive materials such as carbon (e.g., carbon nanotubes, graphene, or other conductive carbon). Noble metals can also be used, but are not required. Other conductive materials such as a doped semiconductor, ceramic, or polymer, or conductive polymers can also be used. Patterned electrodes can be applied by a variety of techniques, including ink jet application, vapor deposition, electrodeposition, ion implantation, and others. Additional disclosure regarding the application of patterned electrodes is disclosed in disclosed in US Patent Application Ser. No. 62/521,175 filed on Jun. 16, 2017, entitled "Method of Making Electrocaloric Articles", the disclosure of which is incorporated herein by reference in its entirety. The electrodes 14 and 16 shown in FIG. 4 can extend from a position in contact with an electrical bus element on one edge of the film and extend across the film to a position that is not in contact with the electrical bus element of opposite polarity on the other edge of the film 12.

As mentioned above, at least one of the electrodes, and in some embodiments both of the electrodes 14 and 16 comprise a patterned disposition of conductive material on the surface of electrocaloric film 12. In some embodiments, the patterned disposition can comprise a plurality of areas on the electrocaloric film surface comprising the conductive material separated by non-conductive spacer areas on the electrocaloric film. In some embodiments, the spacing between areas comprising the conductive material can be in a range with a low end of 0.1 times the film thickness, or 10 times the film thickness, or 0.2 times the film thickness, and an upper end of 5 times the film thickness, or 0.5 times the film thickness, or 2 times the film thickness. In some embodiments, such spacing can provide a technical effect of promoting distribution through the electrocaloric film of an electric field formed when the electrodes are powered. In some embodiments, electrode(s) comprising a patterned disposition of conductive material can optionally have a protective layer over the electrode (e.g., a polymer protective or barrier layer) such as the protective layer 19 shown in FIG. 4. In some embodiments, a protective layer can provide a protective barrier to inhibit moisture or other contaminants from reaching the electrode(s) and/or promote resistance to electrical arcing.

In some embodiments, the electrode(s) can be configured as linear extensions of conductive material along the film surface separated by non-conductive spacer areas on the electrocaloric film. In some embodiments, the spacing between adjacent linear extensions as a function of film thickness can be in any of the above ranges. In some embodiments, the patterned electrodes can provide a technical effect of promoting the accommodation of stress and strain resulting from electrostrictive effects on the electrocaloric film that can accompany the entropy changes in the material that produce the electrocaloric effect. Several example embodiments of configurations are described below with respect to certain electrode configurations (e.g., linear extensions of conductive material along the film surface separated by spacer areas on the electrocaloric film), but the above-described technical effects are not limited to such configurations, as discussed further below.

Figure 5A:
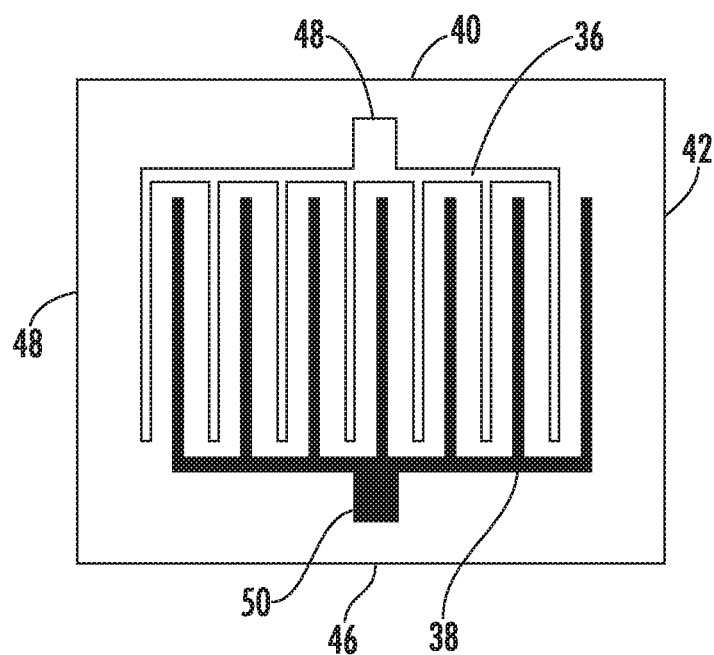
FIG. 5A is a schematic depiction of a top view of patterned electrodes in an interdigitated configuration.
Figure 5B:
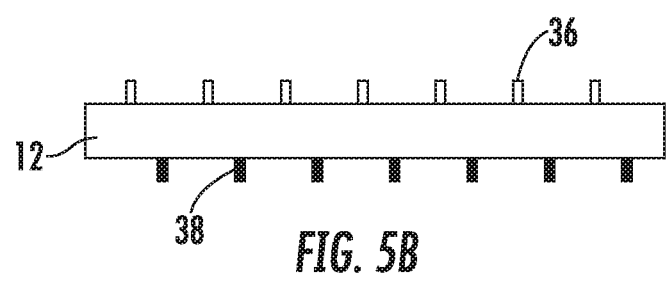
FIG. 5B represents a schematic depiction of cross-section side view of the electrodes on opposite sides of an electrocaloric film.
Figure 5C:
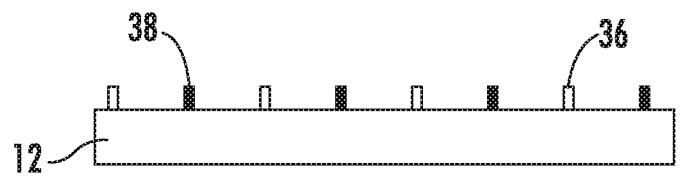
FIG. 5C represents a schematic depiction of cross-section side view of the electrodes on the same side of an electrocaloric film.

An example embodiment of electrodes comprising linear extensions of conductive material is schematically shown in FIGS. 5A, 5B, and 5C. As shown in FIG. 5A, electrodes 36 and 38 are shown in a top view on electrocaloric film 12 having edges 40, 42, 44, and 46. Electrical connectors 48 and 50 provide a connection to a power source and/or controller (not shown). The electrodes 36 and 38 (and thus the first and second film surfaces on which the electrodes are disposed) can be on the same side of the electrocaloric film 12 as shown in FIG. 5B, or on opposite sides of the electrocaloric film 12 as shown in FIG. 5C. As shown in FIGS. 5A-5C, unnumbered spacer areas of film surface free of the electrode material are interposed between the electrode fingers, and spacing between the fingers can be set with respect to the film thickness in any of the ranges described above.

In some embodiments, electrode linear extensions can extend in a direction along the film surface perpendicular to a stress or strain vector on the electrocaloric film during operation. For example, the example embodiment of FIG. 5A shows electrodes extending in a direction perpendicular to a stress or strain vector in a direction between the film edges 42 and 48. Upon the application of a potential between the two electrodes of a polymeric capacitive element (whether top-to-bottom, or interdigitated) an attractive force is developed between opposing electrodes. Consequently, the electrode surfaces are drawn together along a normal line to the potentials; and the material contained underneath the electrodes is compressed. As a result of the compression, the polymer tends to expand in a direction parallel to the field lines due to Poisson's ratio for the polymer, thus exhibiting strain. If the electrode structure attached to the polymer is not sufficiently mechanically compliant to accommodate the strain, the polymer cannot fully expand and therefore the combined electrocaloric-elastocaloric effect can be reduced, leading to a reduced decrease in entropy and reduced electrocaloric effect. Compliant electrode structures can promote the lateral expansion, allowing the polymer to achieve a lower entropy state and greater cooling capacity. In some embodiments (for example in embodiments in which an electrocaloric element is supported on two opposing edge segments, but not on edge segments perpendicular to the supported edges), stress or strain can be incurred by an electrocaloric element in a direction perpendicular to the direction of a shortest line between the supported edges, in which case the electrode linear extensions can extend in a direction parallel to the shortest line between the supported edges. Of course, the supported edge can extend partly around the edge of the electrocaloric film or completely around the edge of the electrocaloric film, and stress or strain can occur along multiple vectors.

Figures 6A, 6B, 6C:
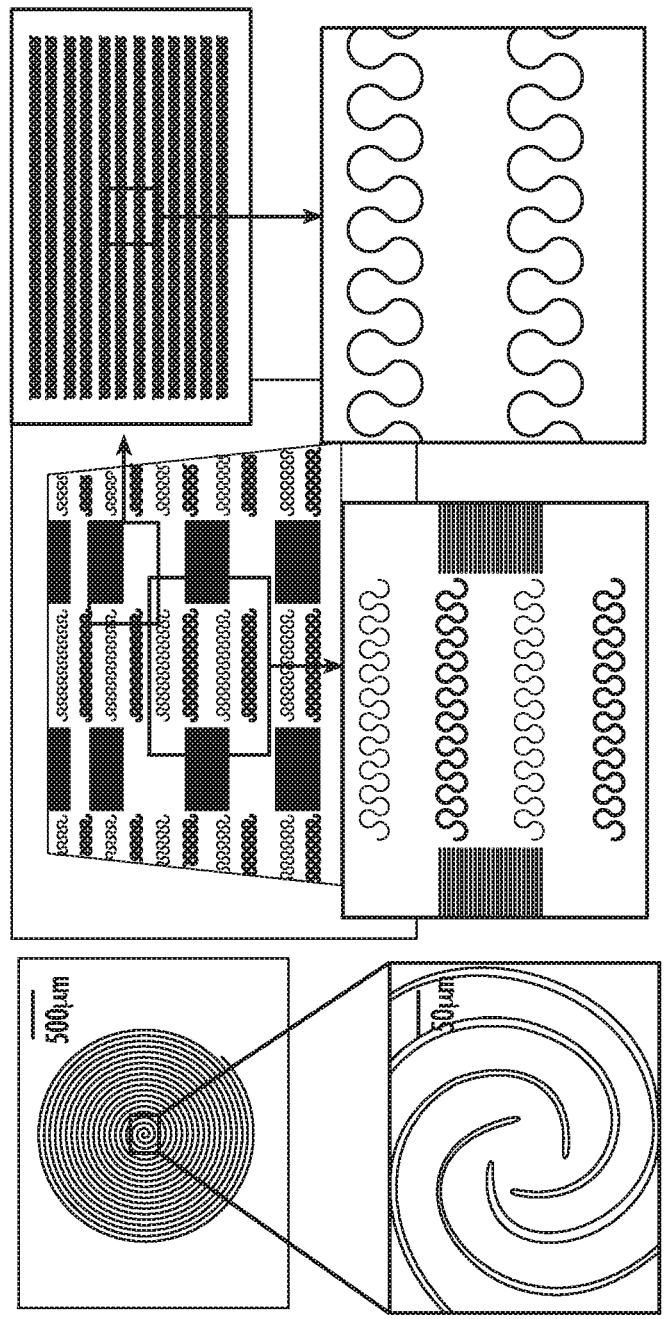
FIGS. 6A, 6B, and 6C, each represents a schematic depiction of a different pattern configuration for patterned electrodes.

The electrode linear extensions shown in FIG. 5A comprise straight finger-like projections, but many other configurations can be used. Curved or complex shaped linear extensions can be used to accommodate a variety of stress/strain patterns that an electrocaloric may be subjected to during operation. Several example embodiments of electrode patterns are shown in a top view in FIGS. 6A, 6B, and 6C. Each of FIGS. 6A, 6B, and 6C shows a lower-magnification upper image and a higher-magnification lower image of example embodiments of curved or complex-shaped linear extensions. In some embodiments curved or complex shaped linear extensions can provide a technical effect of promoting the accommodation of stress or strain in multiple directions, and in some embodiments can promote the accommodation of stress or strain from any direction (i.e., omnidirectional). Other electrode pattern configurations can be used besides spacer area-separated linear extensions. For example, a thickness variation of the electrode conductive material in a direction normal to the film surface (which can be repeated across the surface) can provide a configuration with a wave-like structure or pattern that can absorb stress or strain in a direction along (parallel to) the film surface. Also, alternative embodiments could include electrodes configured with a pattern of an otherwise contiguous metallization field with spacer areas of circular, ovular, polygonal, or other shapes randomly or regularly placed in the metallization field.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate with the spirit and scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

What is claimed is:

1. An electrocaloric module, comprising:
   an electrocaloric element comprising an electrocaloric film, a first electrode on a first surface of the electrocaloric film, and a second electrode on a second surface of the electrocaloric film;
   a support attached along an edge portion of the electrocaloric film, leaving a central portion of the electrocaloric film unsupported film;
   a first thermal connection configured to connect to a first thermal flow path between the electrocaloric element and a heat sink;
   a second thermal connection configured to connect to a second thermal flow path between the electrocaloric element and a heat source; and
   a power connection connected to the electrodes configured to connect to a power source,
   wherein at least one of the first and second electrodes comprises a patterned disposition of conductive material on the film surface;
   wherein the patterned disposition of conductive material comprises a plurality of areas on the electrocaloric film surface comprising the conductive material separated by non-conductive spacer areas on the electrocaloric film;
   wherein the plurality of areas on the electrocaloric film surface comprising the conductive material are spaced apart by a dimension of 0.1 times the film thickness to 10 times the film thickness.

2. A heat transfer system comprising the electrocaloric module of claim 1, a first thermal flow path between a plurality of electrocaloric elements and a heat sink through the first thermal connection, a second thermal flow path between the electrocaloric elements and a heat source through the second thermal connection, an electrical connection between a power source and the electrodes further through the power connection, and a controller configured to selectively apply voltage to activate the electrodes in coordination with heat transfer along the first and second thermal flow paths to transfer heat from the heat source to the heat sink.

3. The electrocaloric module of claim 1, wherein the electrocaloric module comprises a plurality of electrocaloric elements that individually comprise an electrocaloric film, a first electrode on a first surface of the electrocaloric film, and a second electrode on a second surface of the electrocaloric film.

4. The electrocaloric module of claim 1, wherein the first and second electrodes are on the same side of the electrocaloric film.

5. The electrocaloric module of claim 1, wherein the first and second electrodes are on opposite sides of the electrocaloric film.

6. The electrocaloric module of claim 1, wherein the plurality of areas on the electrocaloric film surface comprising the conductive material are spaced apart by a dimension of 0.2 times the film thickness to 5 times the film thickness.

7. The electrocaloric module of claim 1, wherein the plurality of areas on the electrocaloric film surface comprising the conductive material are spaced apart by a dimension of 0.5 times the film thickness to 2 times the film thickness.

8. The electrocaloric module of claim 1, wherein the plurality of areas on the electrocaloric film surface comprising the conductive material are configured as a plurality of linear extensions of conductive material along the film surface separated by spacer areas.

9. The electrocaloric module of claim 8, wherein the linear extensions of conductive material extend parallel to a line between supported edges at opposite ends of the electrocaloric film.

10. The electrocaloric module of claim 8, wherein the linear extensions of conductive material extend in at least two directions.

11. The electrocaloric module of claim 8, wherein the linear extensions of conductive material extend omnidirectionally.

12. The electrocaloric module of claim 1, wherein the supported edge portion of the electrocaloric film extends completely around the edge of electrocaloric film.

13. The electrocaloric module of claim 1, wherein the electrocaloric film is square or rectangle shaped and the supported edge portion of the electrocaloric film extends along two opposing sides of the square or rectangle.

14. The electrocaloric module of claim 1, wherein the electrocaloric film is square or rectangle shaped and the supported edge portion of the electrocaloric film extends along all sides of the square or rectangle.

15. The electrocaloric module of claim 1, wherein a protective layer is disposed over the electrode or electrodes comprising the patterned disposition of conductive material.

16. An electrocaloric module, comprising:
   an electrocaloric element comprising an electrocaloric film, a first electrode on a first surface of the electrocaloric film, and a second electrode on a second surface of the electrocaloric film;
   a support attached along an edge portion of the electrocaloric film, leaving a central portion of the electrocaloric film unsupported film;
   a first thermal connection configured to connect to a first thermal flow path between the electrocaloric element and a heat sink;
   a second thermal connection configured to connect to a second thermal flow path between the electrocaloric element and a heat source; and a power connection connected to the electrodes configured to connect to a power source, wherein at least one of the first and second electrodes comprises a patterned disposition of conductive material on the film surface;

wherein the patterned disposition of conductive material comprises a plurality of areas on the electrocaloric film surface comprising the conductive material separated by non-conductive spacer areas on the electrocaloric film;

wherein the plurality of areas on the electrocaloric film surface comprising the conductive material are configured as a plurality of linear extensions of conductive material along the film surface separated by spacer areas;

wherein at least one of:

the linear extensions of conductive material extend perpendicular to a strain vector on the electrocaloric film during operation;

the linear extensions of conductive material extend parallel to a line between supported edges at opposite ends of the electrocaloric film;

the linear extensions of conductive material extend in at least two directions; and the linear extensions of conductive material extend omnidirectionally.

17. An electrocaloric module, comprising:

an electrocaloric element comprising an electrocaloric film, a first electrode on a first surface of the electrocaloric film, and a second electrode on a second surface of the electrocaloric film;

a support attached along an edge portion of the electrocaloric film, leaving a central portion of the electrocaloric film unsupported film;

a first thermal connection configured to connect to a first thermal flow path between the electrocaloric element and a heat sink;

a second thermal connection configured to connect to a second thermal flow path between the electrocaloric element and a heat source; and a power connection connected to the electrodes configured to connect to a power source, wherein at least one of the first and second electrodes comprises a patterned disposition of conductive material on the film surface;

wherein the patterned disposition of conductive material comprises a variation in thickness in a direction normal to the film surface.

* * * * *